US012464765B2

(12) United States Patent
Wu

(10) Patent No.: US 12,464,765 B2
(45) Date of Patent: Nov. 4, 2025

(54) LDMOS DEVICE AND METHOD FOR FABRICATING THE SAME

(71) Applicant: Silicon-Magic Semiconductor Technology (Hangzhou) Co., Ltd., Hangzhou (CN)

(72) Inventor: Bing Wu, Hangzhou (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 308 days.

(21) Appl. No.: 17/951,589

(22) Filed: Sep. 23, 2022

(65) Prior Publication Data
US 2023/0096725 A1    Mar. 30, 2023

(51) Int. Cl.
| | |
|---|---|
| *H10D 30/65* | (2025.01) |
| *H01L 21/265* | (2006.01) |
| *H01L 21/311* | (2006.01) |
| *H01L 21/3213* | (2006.01) |
| *H10D 30/01* | (2025.01) |
| *H10D 62/17* | (2025.01) |
| *H10D 64/00* | (2025.01) |

(52) U.S. Cl.
CPC ....... *H10D 30/65* (2025.01); *H01L 21/26513* (2013.01); *H01L 21/26586* (2013.01); *H01L 21/31111* (2013.01); *H01L 21/31144* (2013.01); *H01L 21/32133* (2013.01); *H10D 30/0281* (2025.01); *H10D 62/393* (2025.01); *H10D 64/111* (2025.01)

(58) Field of Classification Search
CPC .. H10D 30/65; H10D 64/111; H10D 30/0281; H10D 62/393; H01L 21/26513; H01L 21/26586; H01L 21/31111; H01L 21/31144; H01L 21/32133
See application file for complete search history.

(56) References Cited

U.S. PATENT DOCUMENTS

| | | | |
|---|---|---|---|
| 2015/0249126 A1* | 9/2015 | Kataoka | H10D 62/116 257/343 |
| 2017/0229536 A1* | 8/2017 | Stuber | H10D 84/158 |
| 2022/0130981 A1* | 4/2022 | Wang | H01L 21/765 |

OTHER PUBLICATIONS

IP.COM search history (Year: 2025).*
Espace.net search history (Year: 2025).*

* cited by examiner

*Primary Examiner* — Zandra V Smith
*Assistant Examiner* — Andre C Stevenson
(74) *Attorney, Agent, or Firm* — Osha Bergman Watanabe & Burton LLP

(57) ABSTRACT

An LDMOS device and a fabrication method for fabricating the same are provided. The LDMOS device includes: a substrate, which is of a first dopant type; an epitaxial layer, which is of the first dopant type and formed on the substrate; a gate structure disposed on an upper surface of the epitaxial layer; a well region of the first dopant type and a drift region of a second dopant type, both disposed in the epitaxial layer; a source region of the second dopant type, disposed within the well region; a drain region of the first dopant type, disposed within the drift region; a first insulating layer covering an upper surface and two sidewalls of the gate structure and the upper surface of the epitaxial layer; and a first conducting channel extending through the first insulating layer, source region and epitaxial layer, in contact the source region.

9 Claims, 17 Drawing Sheets

LDMOS DEVICE AND METHOD FOR FABRICATING THE SAME

TECHNICAL FIELD

The present disclosure generally relates to semiconductor devices and, more particularly, to an LDMOS device and a method for fabricating the same.

BACKGROUND

When used as a power device, a lateral double-diffused metal oxide semiconductor (LDMOS) device has advantages such as high gain, high breakdown voltage, high output power, good thermal stability, and high efficiency, and thus is widely applied in products such as radio-frequency power amplifiers, power switches, DC-DC converters, and high-voltage I/O circuits. The on-resistance of the source region of the LDMOS device is used to evaluate the performance of the LDMOS device so as to better evaluate the gain efficacy and output power of the LDMOS device.

Referring to FIG. 1, a conventional LDMOS device includes a substrate 101, an epitaxial layer 102, a well region 103, a drift region 104, a source region 105, a drain region 106, a gate 107, a field plate 108, a first insulating layer 109, a second insulating layer 110, a third insulating layer 111, a source-region conducting trench 112, a drain region conducting trench 113, a drain electrode 114, and a source electrode 115. In general, the multi-layer structure composed of the second insulating layer 110, the field plate 108, the first insulating layer 109, and the epitaxial layer 102 is etched to form the source-region conducting trench 112, and a conductive material is introduced into the source-region conducting trench 112 to form a conducting channel connecting the source region 105 and the substrate 101. The source-region conducting trench 112 and the source region 105 are in contact with each other through their sidewalls only; as a result, the contact is unsatisfactory, leading to an overly high contact resistance. The overly high contact resistance has adverse effects on the stability of the on-resistance of the LDMOS device, the stability of the energy avalanche stress (EAS) of the LDMOS device, and thus the overall performance of the LDMOS device.

SUMMARY

The present disclosure provides an LDMOS device, which includes: a substrate, which is of a first dopant type; an epitaxial layer, which is of the first dopant type and is formed on an upper surface of the substrate; a gate structure disposed on an upper surface of the epitaxial layer; a well region, which is of the first dopant type, and a drift region, which is of a second dopant type, both disposed in the epitaxial layer, with the first dopant type being opposite the second dopant type; a source region, which is of the second dopant type, disposed within the well region; a drain region, which is of the first dopant type, disposed within the drift region; a first insulating layer, covering an upper surface and two sidewalls of the gate structure and the upper surface of the epitaxial layer; a first conducting channel, extending through the first insulating layer, the source region, and the epitaxial layer, and reaching the substrate, wherein the first conducting channel is in contact with an upper surface of the source region to connect the source region and the substrate; a second insulating layer, disposed above the first conducting channel and the first insulating layer; a second conducting channel, extending at least to the drain region; a drain electrode, connected to the drain region by the second conducting channel; a gate electrode, connected to the gate structure; and a source electrode, disposed on a surface of the substrate facing away from the epitaxial layer.

In an embodiment, a protrusion is formed at a point where the first conducting channel and the upper surface of the source region meet, and wherein the protrusion divides the first conducting channel into an upper portion and a lower portion, and a width of the upper portion of the first conducting channel is greater than a width of the lower portion of the first conducting channel.

In an embodiment, the upper portion of the first conducting channel and the gate structure are spaced apart by a gap in a range of 0.1 µm to 0.3 µm, wherein the first insulating layer fills the gap between the first conducting channel and the gate structure.

In an embodiment, the LDMOS device further comprises a body contact region, which is of the first dopant type, disposed in the substrate, and connected to the source region by the first conducting channel.

In an embodiment, the LDMOS device further comprises a doped region disposed in the epitaxial layer, which is of a first dopant type, wherein the doped region is disposed in the epitaxial layer adjacent to the first conducting channel, and connects the source region and the substrate.

In an embodiment, the LDMOS device further comprises a shielding conductor layer and a third insulating layer, wherein the shielding conductor layer is disposed on the first insulating layer and above a portion of the gate structure and a portion of the drift region, and the third insulating layer covers an upper surface and sidewalls of the shielding conductor layer and covers an upper surface of the first insulating layer exposed by the shielding conductor layer.

In an embodiment, the second insulating layer is disposed above the first conducting channel and the first insulating layer, with the second insulating layer being disposed on an upper end of the first conducting channel and on an upper surface of the third insulating layer above the first insulating layer.

In an embodiment, the first conducting channel sequentially extend through the third insulating layer, the first insulating layer, the source region, and the epitaxial layer.

In an embodiment, the second conducting channel extends through the second insulating layer, the third insulating layer, and the first insulating layer, and is in contact the drain region.

The present disclosure further provides a method for fabricating an LDMOS device, comprising: providing a substrate, which is of a first dopant type, forming an epitaxial layer on a surface of the substrate, wherein the epitaxial layer is of the first dopant type; forming a gate structure on an upper surface of the epitaxial layer; forming a well region, which is of the first dopant type, and a drift region, which is of a second dopant type, in the epitaxial layer; forming a source region within the well region, wherein the source region is of the second dopant type, and the first dopant type is opposite the second dopant type; forming a first insulating layer on the upper surface of the epitaxial layer and above the gate structure; forming a first trench, wherein the first trench extends through the first insulating layer, the source region, and the epitaxial layer, is in contact with the substrate, and exposes an upper surface of the substrate and an upper surface of the source region; filling the first trench with a first conductive material to form a first conducting channel, wherein the first conducting channel is in contact with the upper surface of the source region and has a lower surface in contact with the substrate so as to connect the source region and the substrate; forming a second insulating layer above the first conducting channel and the first insulating layer; forming a second trench, which extends vertically and partially exposes the drift region; forming a drain region in a portion of the drift region exposed by the second trench, wherein the drain region is of a second dopant type, and then filling the second trench with a second conductive material to form a second conducting channel connected to the drain region; forming a drain electrode and a gate electrode, wherein the drain electrode is connected to the drain region by the second conducting channel, and the gate electrode is connected to the gate structure; and forming a source electrode, covering a surface of the substrate facing away from the epitaxial layer.

In an embodiment, the step of forming the first trench comprises: forming the first trench with the first insulating layer functioning as a mask, wherein the first trench extends through the first insulating layer, the source region, and the epitaxial layer, and is in contact with the substrate and partially exposes the substrate; and performing isotropic etching on the first insulating layer according to a thickness of the source region to expose the upper surface of the source region, wherein the exposed upper surface of the source region has a width no greater than that of the source region, such that the first trench and the gate structure are spaced apart from each other by the first insulating layer.

In an embodiment, a width of isotropic etching is controlled during the etching of the first insulating layer, such that an upper portion of the first conducting channel and the gate structure are spaced apart by a gap of 0.1 μm to 0.3 μm, and the first insulating layer fills the gap between the first conducting channel and the gate structure.

In an embodiment, the method further comprises: after forming the first trench but before filling the first trench, forming a body contact region in a portion of the substrate exposed by the first trench, allowing the body contact region and the source region to be connected by the first conducting channel upon formation of the first conducting channel, wherein the body contact region is of the first dopant type.

In an embodiment, the method further comprises: after forming the first trench but before filling the first trench, forming a doped region of a first dopant type between the first insulating layer and the first trench, wherein the source region and the substrate are connected by the doped region of the first dopant type.

In an embodiment, the step of forming the doped region of the first dopant type comprises implanting ions of a first dopant type onto a sidewall of the first insulating layer adjoining the first trench, at an angle of 0 to 7 degrees relative to the perpendicular direction.

In an embodiment, the step of forming the second trench comprises: forming the second trench with the second insulating layer functioning as a mask, wherein the second trench extends through the second insulating layer and the first insulating layer, is in contact with the drain region, and at least partially exposes the drain region.

In an embodiment, after forming the first insulating layer but before forming the first trench, the method further comprises:
    forming a shielding conductor layer on an upper surface of the first insulating layer;
    etching the shielding conductor layer to at least expose a portion of the first insulating layer that is above the drift region of the second conductivity type and the first insulating layer above a portion of the gate structure; and
    forming a third insulating layer, for which coverings an upper surface and sidewalls of the shielding conductor layer and covering an upper surface of the first insulating layer exposed from by the shielding conductor layer.

In an embodiment, the step of forming the first trench comprises: forming the first trench with the third insulating layer functioning as a mask, wherein the first trench extends through the third insulating layer, the first insulating layer, the source region, and the epitaxial layer, and the first trench is in contact with the substrate and partially exposes the substrate.

In an embodiment, the step of forming the second trench comprises: forming the second trench with the second insulating layer functioning as a mask, the second trench extends through the second insulating layer, the third insulating layer, and the first insulating layer, and the second trench is in contact with the drain region and at least partially exposes the drain region.

In an embodiment, the step of forming the second insulating layer comprises: forming the second insulating layer on an upper end of the first conducting channel and above the first insulating layer.

According to the disclosure, the LDMOS device and the method for fabricating the same have advantages as follows: a first conducting channel is connected between a source region and a source metal layer and is in contact with an upper surface of the source region to thereby reduce on-resistance of the source region, enhance EAS capability, and thus augment the overall performance of the LDMOS device.

DETAILED DESCRIPTION

Figure 1:
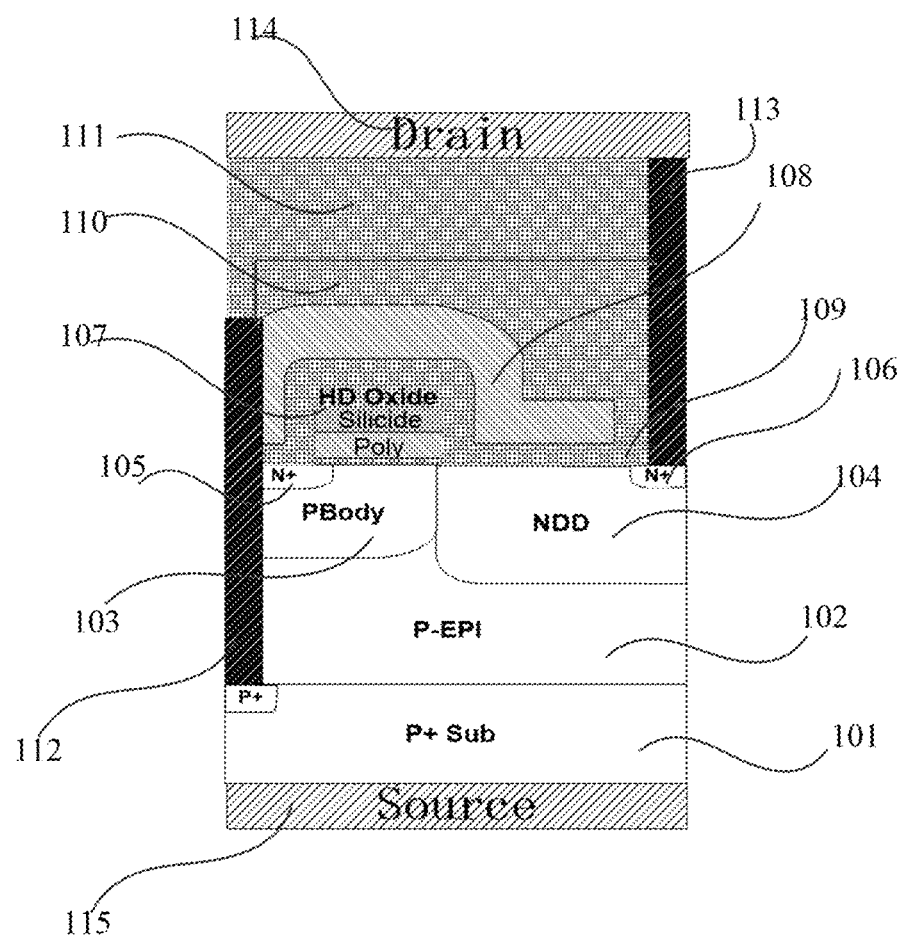
FIG. 1 is a schematic cross-sectional view of a conventional LDMOS device.

The present disclosure is hereunder illustrated by specific embodiments to enable persons skilled in the art to easily gain insight into the other advantages and effects of the disclosure. The disclosure can be implemented or applied in accordance with any other variant embodiments. Details presented herein may be modified or changed from different perspectives and for different applications without departing from the spirit of the disclosure. Combinations of the following embodiments and features therein will be possible unless otherwise contradictory.

The present disclosure is depicted by the accompanying drawings and further described hereunder. In the accompanying drawings, like reference numerals designate like elements. For the sake of illustration, the elements of the drawings are not necessarily drawn to scale relative to each other. It is possible that some well-known elements are not shown in the drawings. For the sake of brevity, it is also possible that an intermediate semiconductor structure which results from one or more steps is illustrated in a drawing.

When it comes to doping concentration in the disclosure, symbols "+" and "−" next to symbol "n" or "p" denote relative doping concentrations. For example, "n+" describes a highly-doped n-type region. However, regions denoted with the same symbols do not necessarily have the same absolute doping concentration. For instance, two highly-doped n-type regions may have the same absolute doping concentration or different absolute doping concentrations.

When the description of the structure of a device involves stating that a first layer or region is disposed on or above a second layer or region, it means that the first layer or region is disposed directly on the second layer or region, or that a third layer/region is disposed between the first layer/region and the second layer or region. Furthermore, if the device is turned upside down, the first layer or region will be disposed under or below the second layer or region.

In the disclosure, the term "semiconductor structure" is a collective term for all the intermediate semiconductor structures formed as a result of each step of fabricating a semiconductor device, including all the layers or regions formed as of the corresponding step. The term "laterally" means being substantially parallel to the substrate. The term "vertical" means being substantially perpendicular to the substrate.

Figure 2:
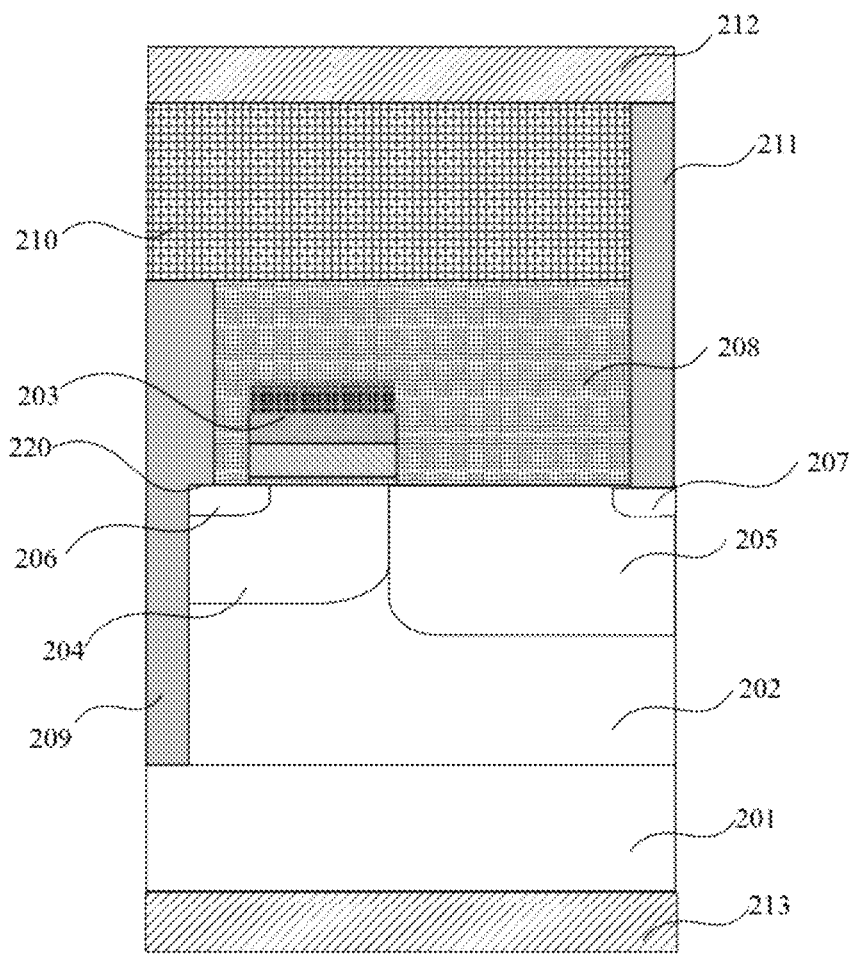
FIG. 2 is a schematic cross-sectional view of an LDMOS device according to an embodiment of the present disclosure.

In view of the above-mentioned drawbacks of the related art, the present disclosure provides an LDMOS device. Referring to FIG. 2, a schematic cross-sectional view of an LDMOS device is shown.

As shown in FIG. 2, the LDMOS device comprises: a substrate 201, which is of a first dopant type; an epitaxial layer 202, which is of the first dopant type and is disposed on an upper surface of the substrate 201; a gate structure 203 disposed on an upper surface of the epitaxial layer 202; a well region 204, which is of the first dopant type, and is disposed in the epitaxial layer 202 and on one side of the gate structure 203, wherein a portion of the upper surface of the well region 204 is in contact with the lower surface of the gate structure 203, and a width of the well region 204 is greater than that of the gate structure 203; a drift region 205, which is of a second dopant type, disposed in the epitaxial layer 202 and on the other side of the gate structure 203, and not in contact with the well region 204, wherein the second dopant type is different from the first dopant type; a source region 206, which is of the second dopant type and is disposed in the well region 204, wherein the upper surface of the source region 206 extends beyond the lower surface of the gate structure 203; a drain region 207, which is of a second dopant type and is disposed in the drift region 205; a first insulating layer 208 disposed above the epitaxial layer 202 and the gate structure 203 and covering the upper surface and two sidewalls of the gate structure 203, and the upper surface of the epitaxial layer 202; a first conducting channel 209, which extends through the first insulating layer 208, the source region 206 and the epitaxial layer 202 consecutively and is in contact with the substrate 201, wherein the lower surface of the first conducting channel 209 is in contact with the substrate 201, and the first conducting channel 209 is in contact with the upper surface of the source region 206, thereby connecting the source region 206 and the substrate 201; a second insulating layer 210 disposed on the upper end of the first conducting channel 209 and the upper surface of the first insulating layer 208; a second conducting channel 211, which extends through the second insulating layer 210 and the first insulating layer 208 and is in contact with the drain region 207, wherein the lower surface of the second conducting channel 211 connects to the drain region 207; a drain electrode 212 disposed on the upper surface of the second conducting channel 211 and connected to the drain region 207 by the second conducting channel 211; a gate electrode (not indicated by any reference numeral) connected to the gate structure 203; and a source electrode 213 disposed on a surface of the substrate 201 facing away from the epitaxial layer 202.

Figure 6A:
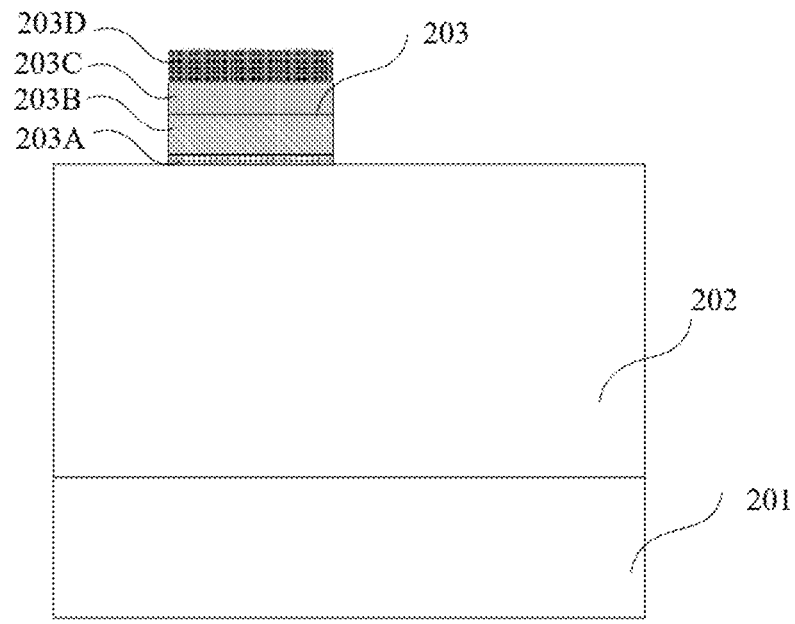
FIGS. 6A~6N are schematic cross-sectional views of intermediate structures of an LDMOS device fabricated after each step following a method for fabricating an LDMOS device according to an embodiment of the disclosure.
Figure 6B:
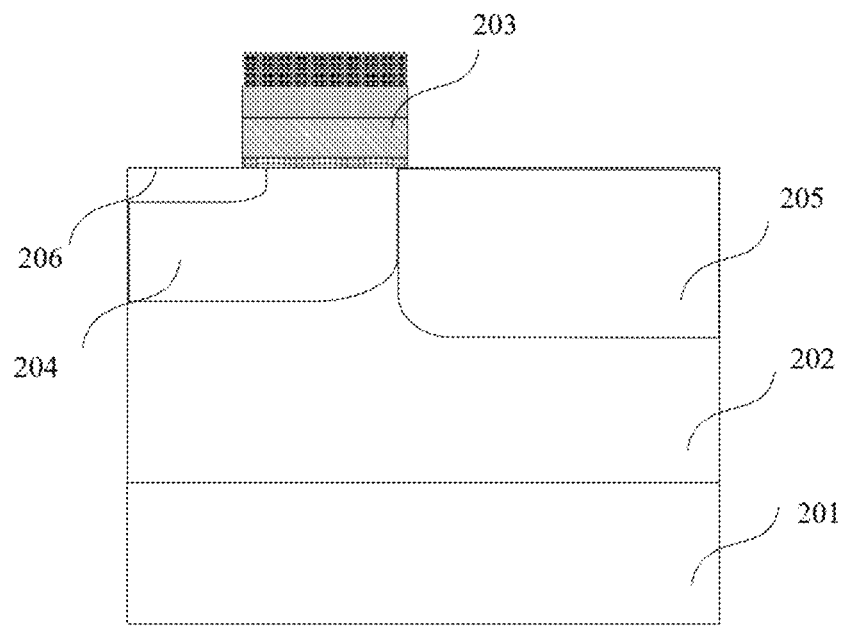
Figure 6C:
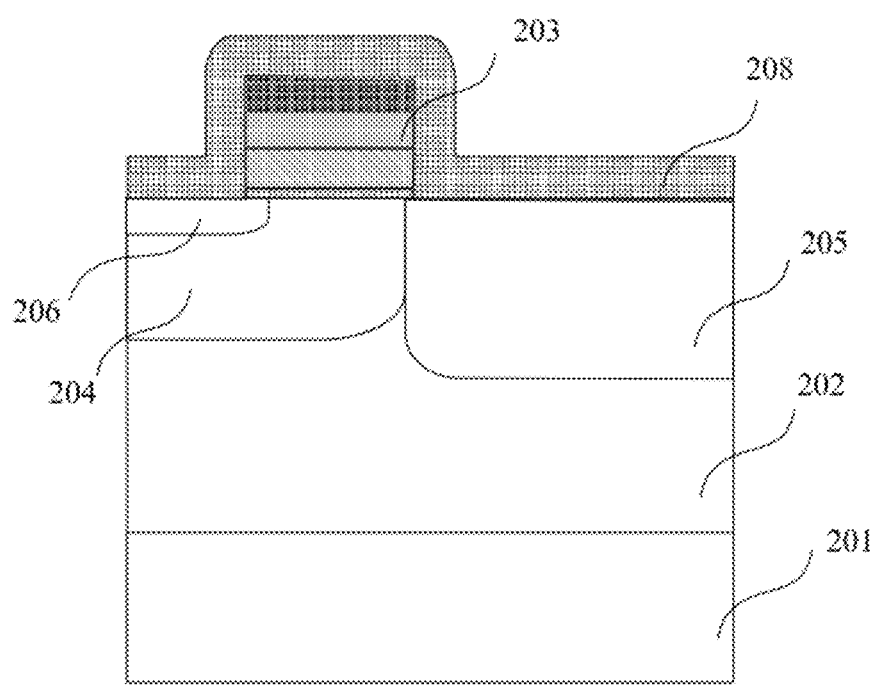
Figure 6D:
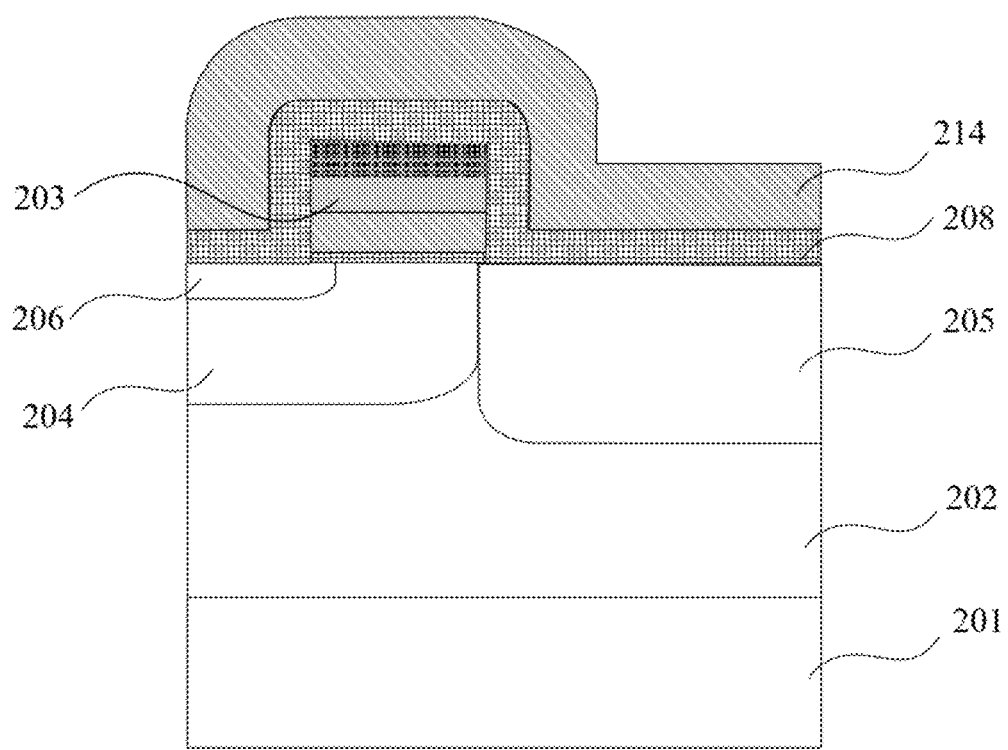
Figure 6E:
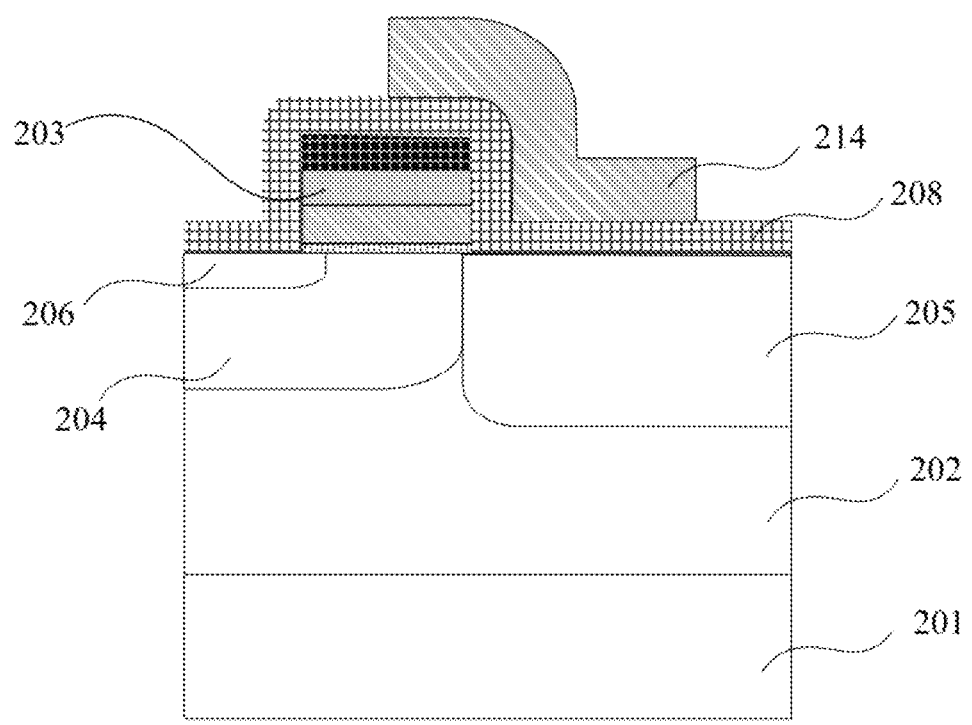
Figure 6F:
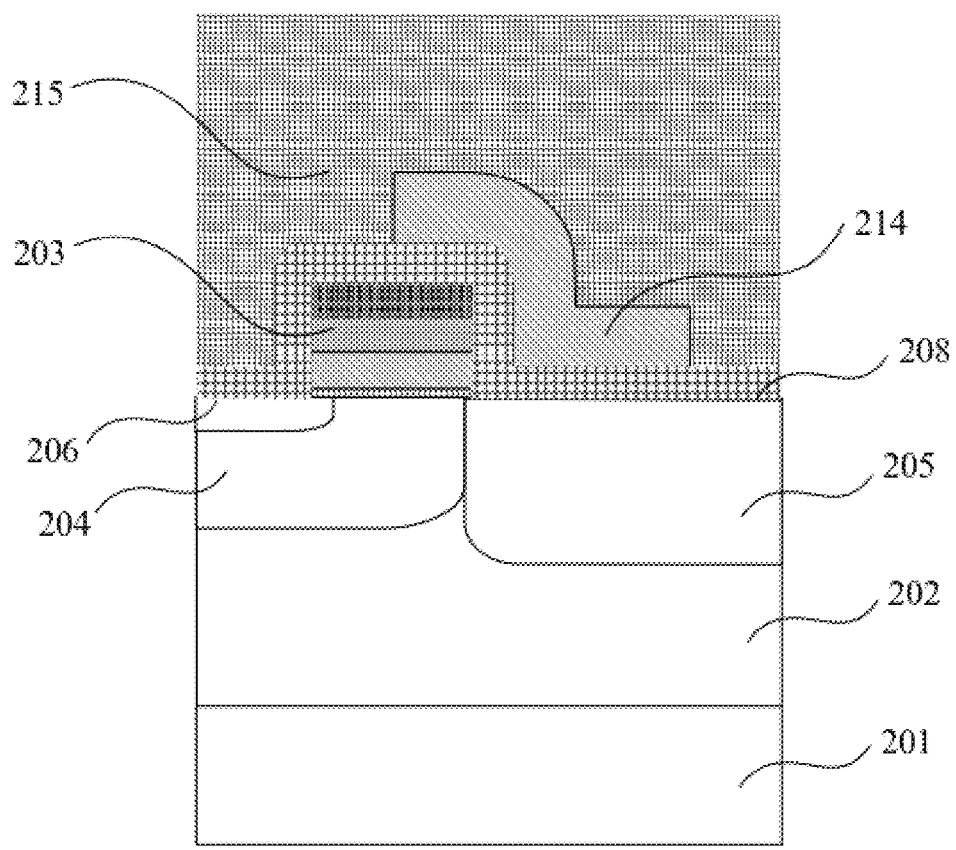
Figure 6G:
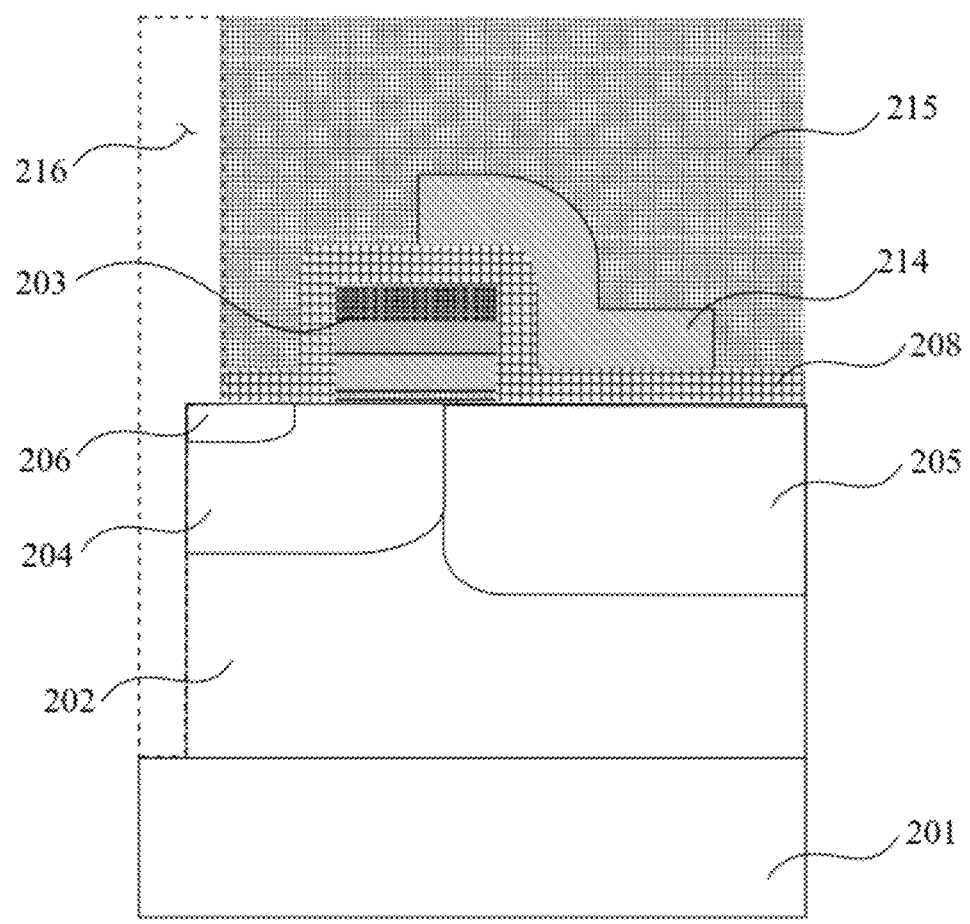
Figure 6H:
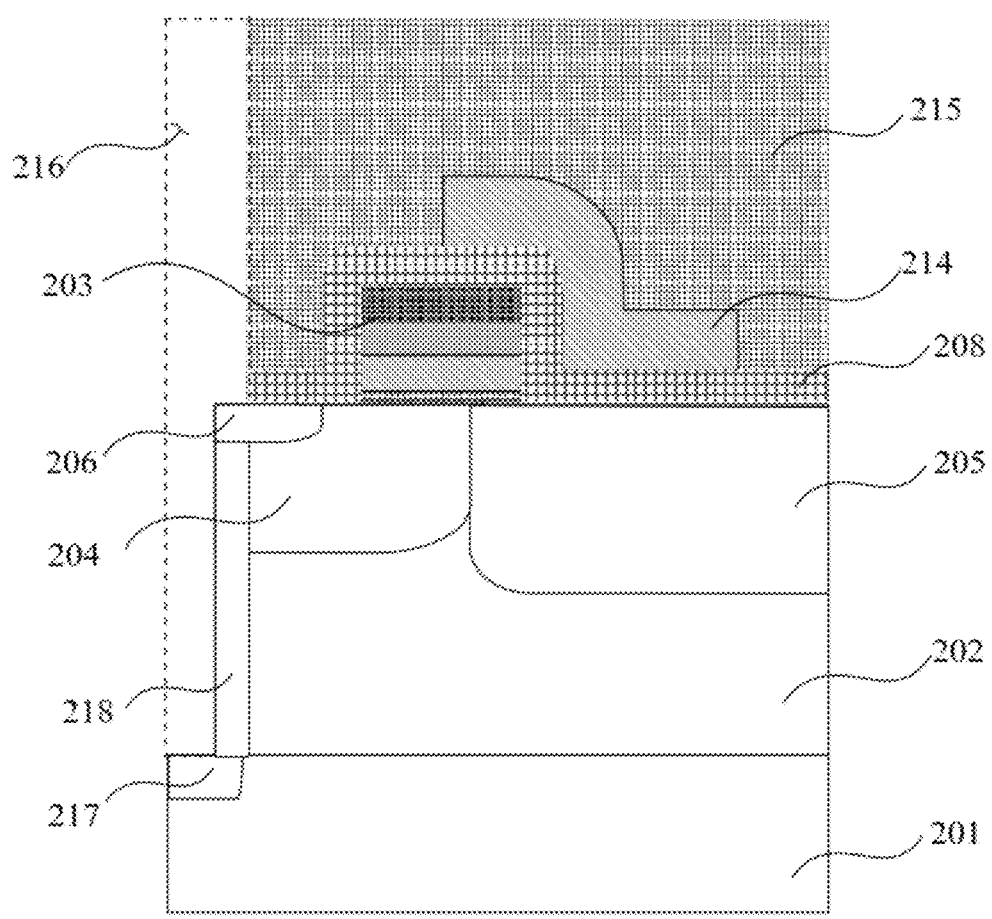
Figure 6I:
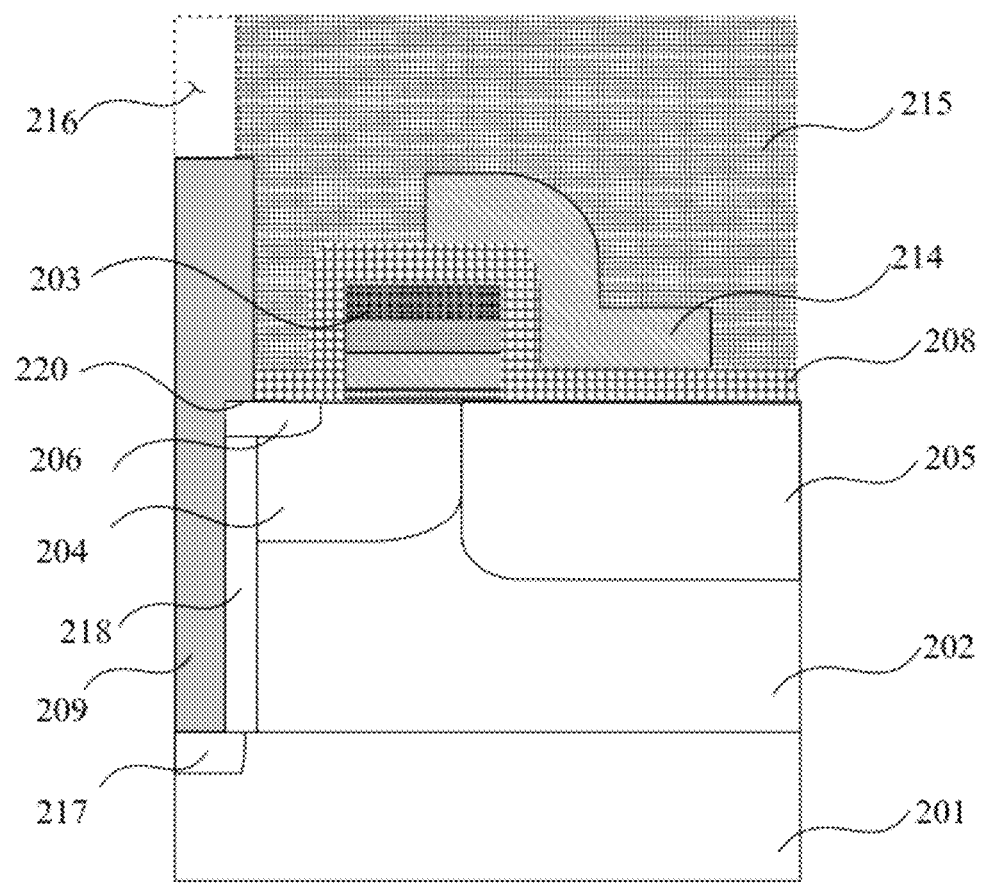

As shown in FIG. 6I, a protrusion 220 is formed at a position where the first conducting channel 209 and the upper surface of the source region 206 meet. The protrusion 220 divides the first conducting channel 209 into an upper portion and a lower portion. A width of the upper portion of the first conducting channel 209 is greater than that of the lower portion of the first conducting channel 209 so as to maximize the contact area between the first conducting channel 209 and the upper surface of the source region 206 and thereby further reduce the contact resistance of the source region 206 and enhance product performance without changing dimensions of the device's crystal structure.

While the width of the upper portion of the first conducting channel 209 is greater than the width of the lower portion of the first conducting channel 209, the first insulating layer 208 also separates the upper portion of the first conducting channel 209 and the gate structure 203 to thereby prevent the source region 206 from connecting to the gate structure 203.

Optionally, the upper portion of the first conducting channel 209 and the gate structure 203 are spaced apart by a gap in a range of 0.1 μm to 0.3 μm, wherein the first insulating layer 208 fills the gap between the upper portion of the first conducting channel 209 and the gate structure 203.

In the LDMOS device of the disclosure, the first conducting channel 209 is connected between the source region 206 and the substrate 201 and is in contact with the upper surface of the source region 206, such that electron carriers can migrate laterally quickly, thereby reducing the on-resistance of the source region 206, enhancing EAS capability, augmenting the overall performance of the LDMOS device, and boosting the stability of the system.

In the disclosure, the dopant type of a certain region is determined by the type of impurity atoms with which a neutral substrate is doped to form the certain region. For instance, the germanium or silicon semiconductor substrate 201 is doped with group V elements (providing electrons), such as nitrogen, phosphorus and arsenic, to form a n-type substrate, and the germanium or silicon semiconductor substrate 201 is doped with a group III elements (providing holes), such as boron and aluminum, to form a p-type substrate. In an example, p-type is the first dopant type, and the second dopant type is n-type. In another example, n-type is the first dopant type, and the second dopant type is p-type. The substrate 201, which is of the first dopant type is a heavily-doped substrate 201 with a doping concentration of $10^{19}$ $cm^{-3}$ or above. The epitaxial layer 202, which is also of the first dopant type, is a lightly-doped epitaxial layer 202 with a lower doping concentration (for example, $10^{16}$~$10^{17}$ $cm^{-3}$) than that of the substrate 201.

Figure 3:
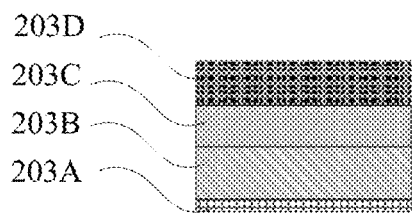
FIG. 3 is a schematic cross-sectional view of a gate structure of the LDMOS device according to an embodiment of the disclosure.

In one or more embodiments illustrated by FIG. 3, the gate structure 203 comprises, from bottom to top, a gate dielectric layer 203A, a gate conductive layer 203B, a silicide layer 203C and a fourth insulating layer 203D. The gate dielectric layer 203A is disposed on the upper surface of the epitaxial layer 202 to space apart the epitaxial layer 202 and the gate conductor layer 203B from each other. The gate conductive layer 203B is preferably a polycrystalline silicon layer, because polycrystalline silicon is tolerant to high temperature.

Figure 4:
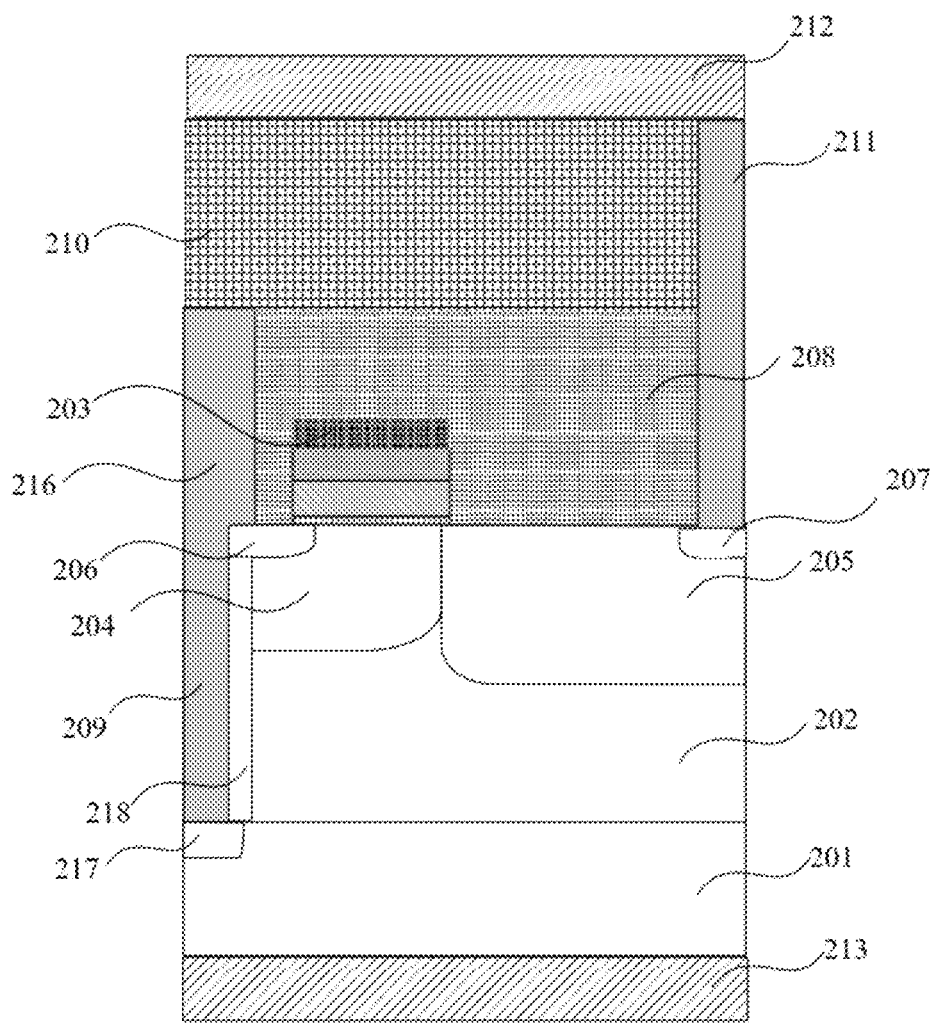
FIG. 4 is a schematic cross-sectional view of an LDMOS device according to an embodiment of the present disclosure.

In one or more embodiments illustrated by FIG. 4, a body contact region 217, which is of the first dopant type, is formed at the bottom of the first conducting channel 209, that is, at a point where the substrate 201 and the first conducting channel 209 are in contact with each other. The body contact region 217 is disposed in the substrate 201 and heavily doped, for example, to attain a doping concentration of $10^{19}$ cm$^{-3}$. The first conducting channel 209 connects the body contact region 217 and the source region 206; thus, it reduces the resistance of the epitaxial layer in the longitudinal direction, compared with its conventional counterpart.

As shown in FIG. 4, the device further comprises a vertically-extending doped region 218, which is of the first dopant type. A sidewall of the doped region 218 adjoins a sidewall of the first conducting channel 209. An upper surface of the doped region 218 is in contact with the source region 206. The doped region 218 extends through the well region 204 which is of the first dopant type and the epitaxial layer 202 consecutively. The doped region 218 dopant type extends to come into contact with the substrate 201. The upper surface of the doped region 218 dopant type is in contact with the source region 206. The lower surface of the doped region 218 dopant type is in contact with the substrate 201 so as to connect the source region 206 and the substrate 201 and thereby reduce the contact resistance of the source region 206.

For example, the first conducting channel 209 and the second conducting channel 211 are filled with a multilayer metallic structure of Ti/TiN/W.

Figure 5:
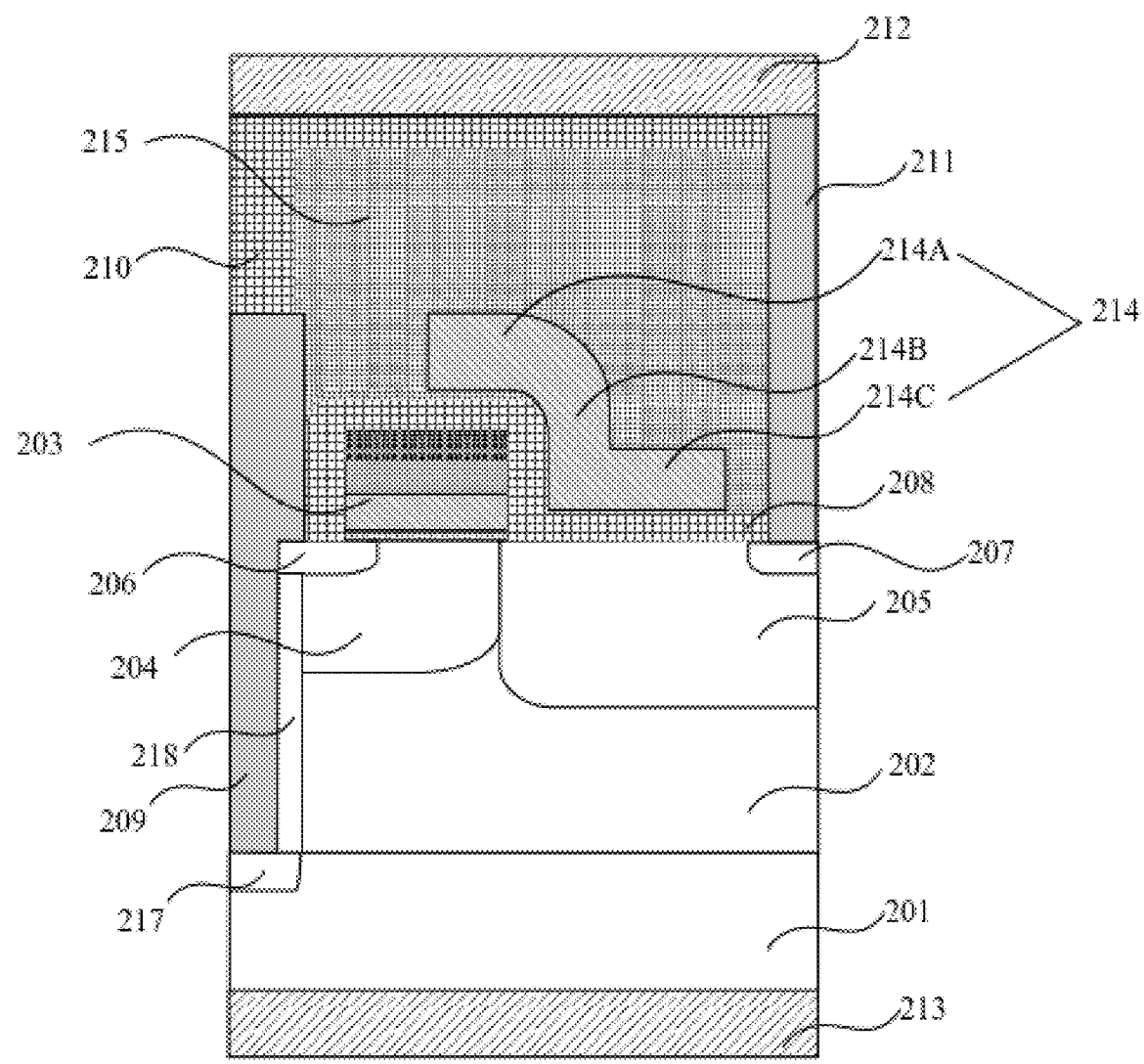
FIG. 5 is a schematic cross-sectional view of an LDMOS device according to an embodiment of the present disclosure.

In one or more embodiments illustrated by FIG. 5, the device further comprises a shielding conductor layer 214 and a third insulating layer 215. The shielding conductor layer 214 comprises a first horizontal portion 214A disposed above a portion of the gate structure 203, a vertical portion 214B disposed on a sidewall of the gate structure 203, and a second horizontal portion 214C disposed above the drift region 205. The third insulating layer 215 covers the upper surface and sidewalls of the shielding conductor layer 214 and covers an upper surface of portions of the first insulating layer 208 exposed by the shielding conductor layer 214. The portions of the first insulating layer 208 exposed by the shielding conductor layer 214 comprises: a portion of the first insulating layer 208 disposed above the source region 206, a portion of the first insulating layer 208 disposed above a portion of the gate structure 203 not covered with the shielding conductor layer 214, and a portion of the first insulating layer 208 disposed above a portion of the drift region 205 not covered with the shielding conductor layer 214.

In an embodiment, the first conducting channel 209 extends through the third insulating layer 215, the first insulating layer 208, the source region 206, the well region 204, and the epitaxial layer 202 consecutively. The first conducting channel 209 is in contact with the substrate 201. Thus, the sidewall of the first conducting channel 209 is in contact with the third insulating layer 215, the first insulating layer 208, the source region 206, the well region 204, and the epitaxial layer 202. The second insulating layer 210 is disposed on the upper end of the first conducting channel 209 and on the upper surface of the third insulating layer 215. The second conducting channel 211 extends through the second insulating layer 210, the third insulating layer 215, and the first insulating layer 208 consecutively. The second conducting channel 211 is in contact with the drain region 207. Thus, the sidewall of the second conducting channel 211 is in contact with the second insulating layer 210, the third insulating layer 215, and the first insulating layer 208. The reliability of the LDMOS device is enhanced by increasing the distribution of optimal surface electric field of the shielding conductor layer 214, boosting breakdown voltage, and weakening the electric field in the vicinity of the gate. The first insulating layer 208 above the source region 206 is exposed by the shielding conductor layer 214 to facilitate the etching of the first insulating layer 208 to obtain the first trench 216, thereby improving the quality of the sidewall of the first insulating layer 208 obtained from filling the first trench 216.

The disclosure further provides a method for fabricating an LDMOS device. In some examples, the LDMOS device is an LDMOS device described in any of the above embodiments.

Figure 6J:
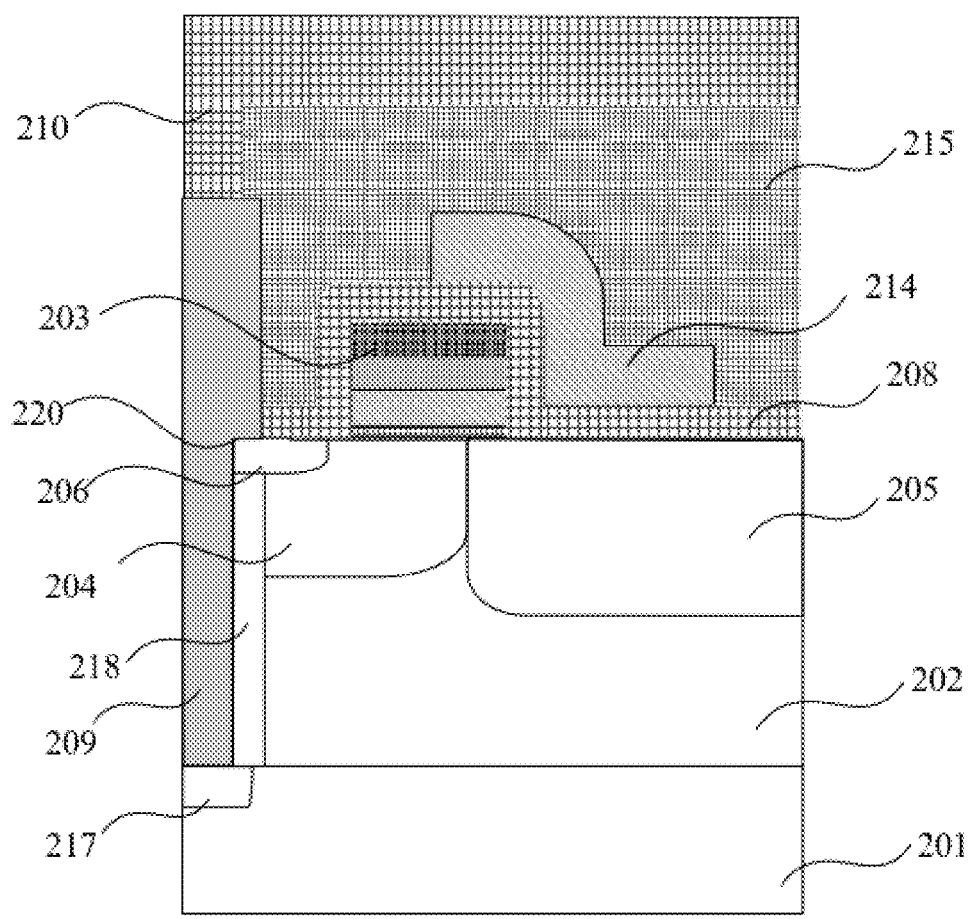
Figure 6K:
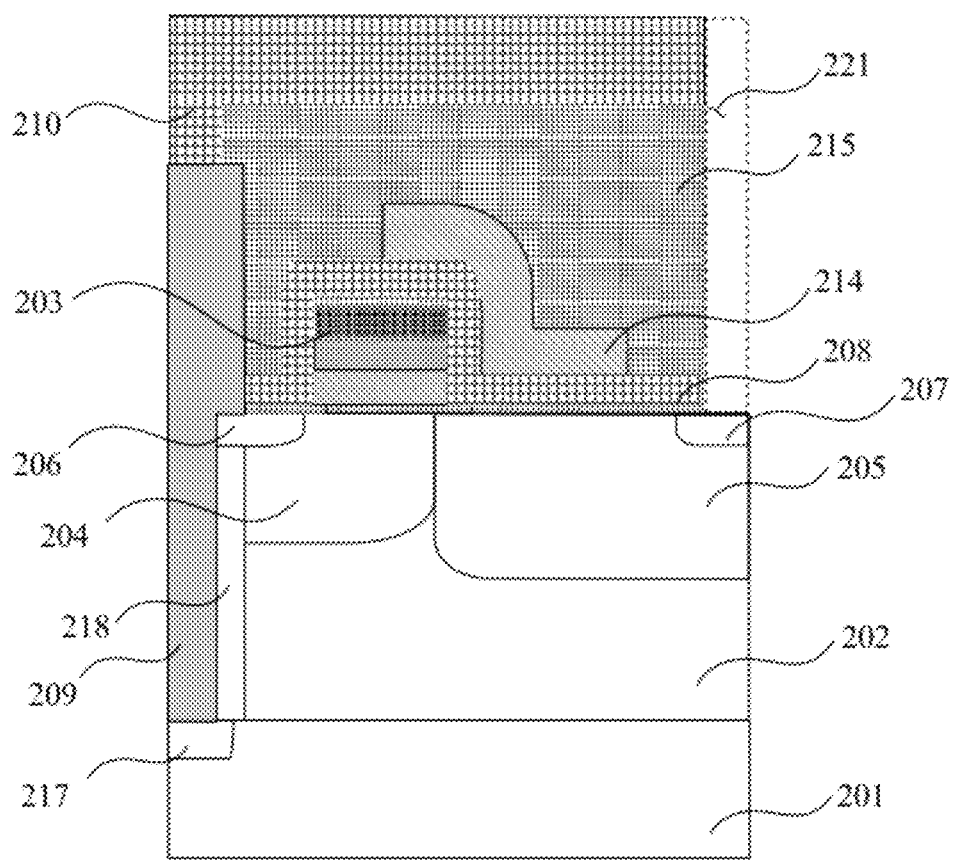
Figure 6L:
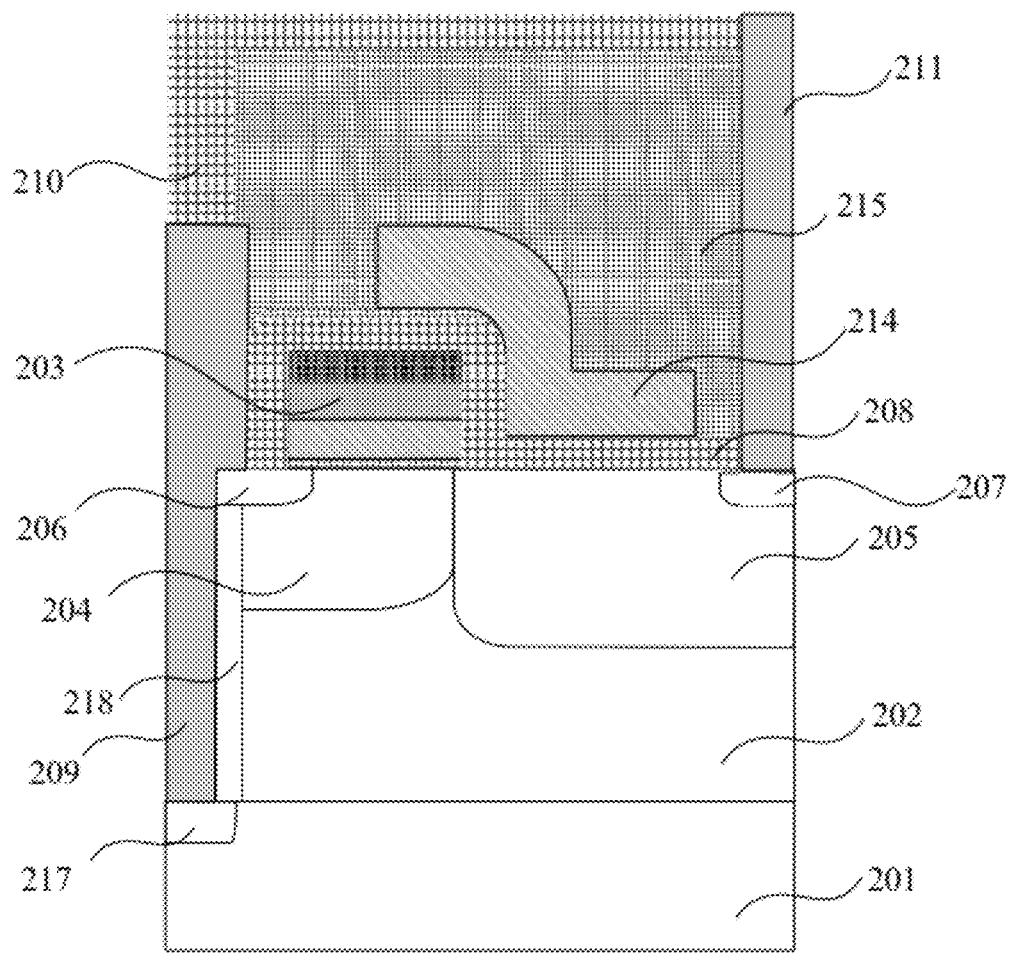
Figure 6M:
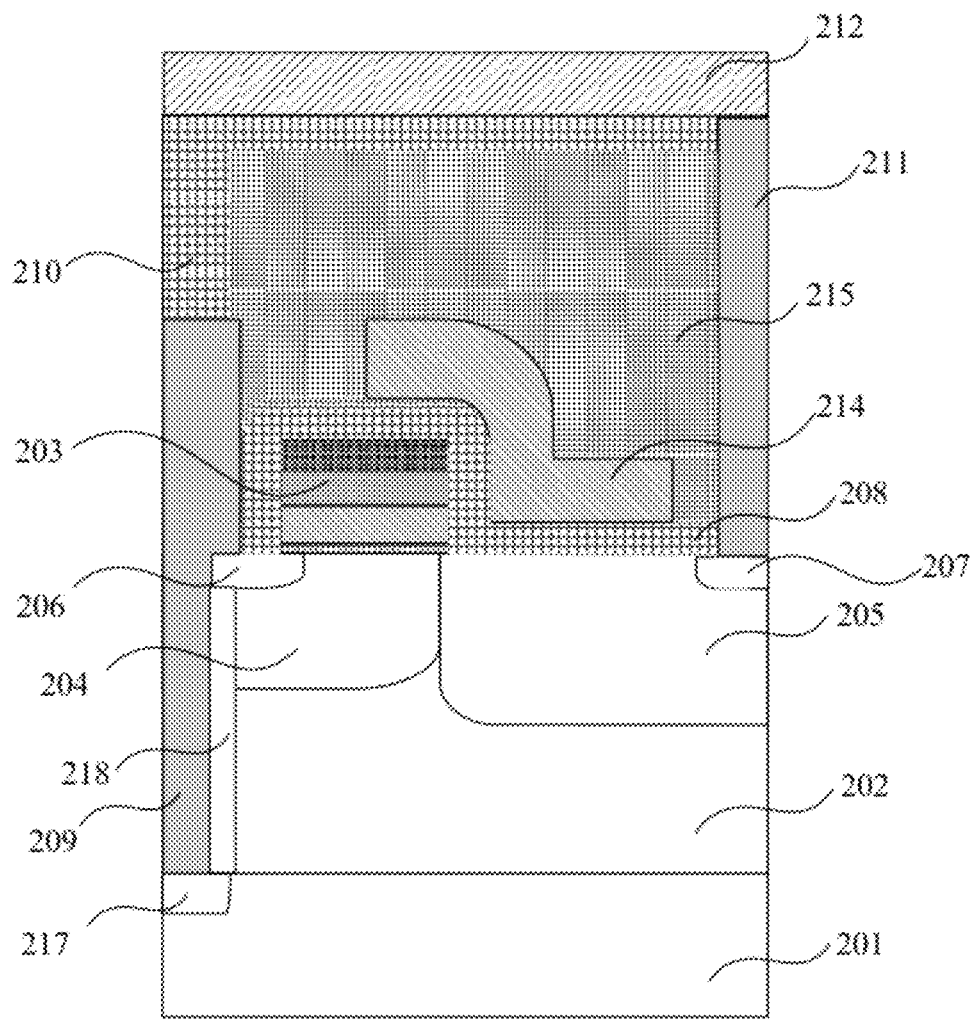
Figure 6N:
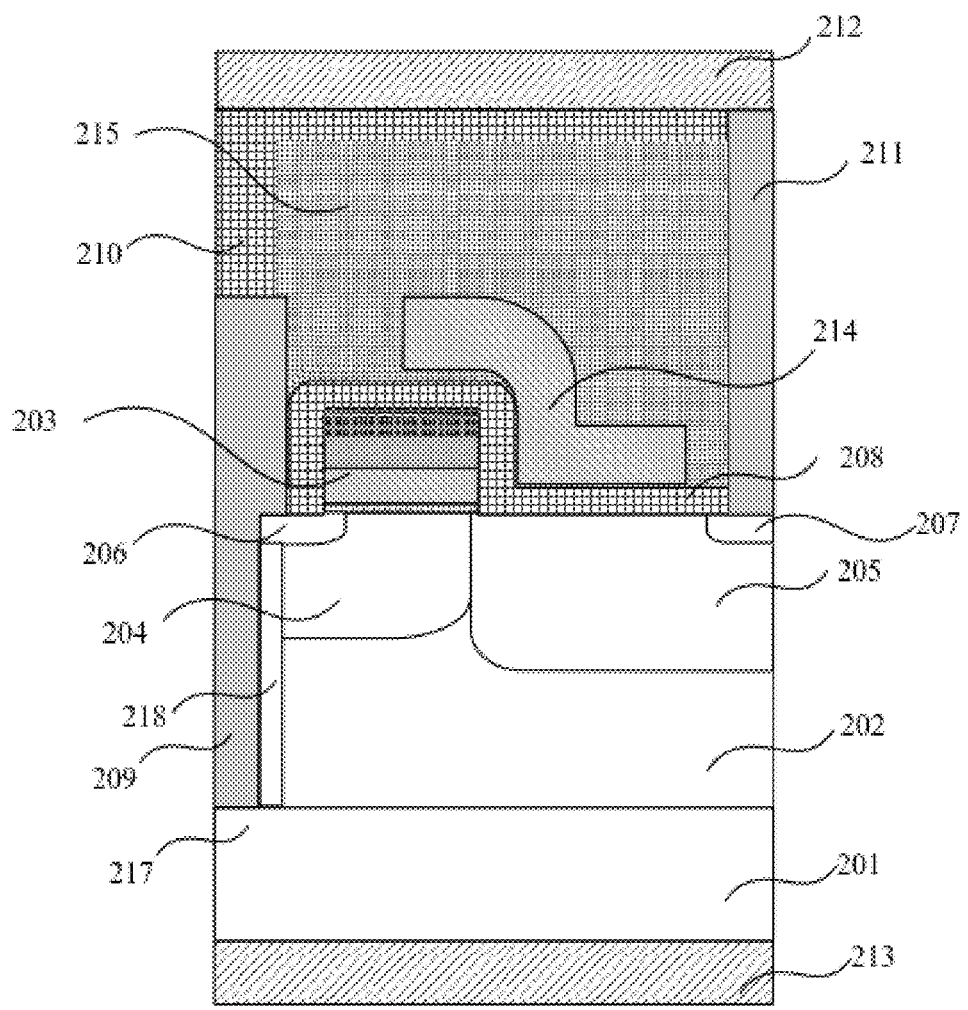

FIGS. 6A~6N show schematic cross-sectional views of the intermediate structures of the LDMOS device fabricated in each of the major steps of the method.

As shown in FIG. 6A, the method includes: providing a substrate 201, which is of a first dopant type, forming the epitaxial layer 202 of the first dopant type on a surface of the substrate 201; and forming a gate dielectric layer 203A, a gate conductive layer 203B, a silicide layer 203C and a fourth insulating layer 203D on an upper surface of the epitaxial layer 202 sequentially, so as to form a gate structure 203.

A first oxide layer is grown on the upper surface of the epitaxial layer 202 to form the gate dielectric layer 203A. Deposited sequentially on a surface of the first oxide layer are a polycrystalline silicon layer, a metallic silicide layer and a second oxide layer, which correspond to the gate conductive layer 203B, the silicide layer 203C and the fourth insulating layer 203D, respectively; then, the three deposited layers are etched to form the gate structure 203.

As shown in FIG. 6B, the upper surface of the epitaxial layer 202 includes a first part and a second part, and the gate structure 203 is formed on the first part; a self-alignment process is performed to implant ions of the first dopant type onto the first part of the upper surface of the epitaxial layer 202, and a high-temperature drive-in process is performed to form a well region 204, which is of the first dopant type. Ions of the second dopant type are implanted onto the second part of the upper surface of the epitaxial layer 202, and a high-temperature drive-in process is performed to form a drift region 205, which is of the second dopant type. A heat treatment process, such as annealing, is carried out to allow the well region 204 to diffuse across the epitaxial layer 202 and thereby come into contact with the drift region 205. Ions of the second dopant type are implanted on the well region 204 to form a source region 206, which is of the second dopant type. The source region 206 and the drift region 205 are spaced apart from each other.

As shown in FIG. 6C, the first insulating layer 208 is deposited on the upper surface of the epitaxial layer 202 and above the gate structure 203. In an example, the first insulating layer 208 is an oxide layer.

As shown in FIG. 6D and FIG. 6E, the method further includes: depositing a shielding conductor layer 214 on an upper surface of the first insulating layer 208, etching the shielding conductor layer 214 to expose a portion of the first insulating layer 208 above the source region 206, a portion of the first insulating layer 208 above a portion of the gate structure 203 not covered with the shielding conductor layer 214, and a portion of the first insulating layer 208 above a portion of the drift region 205 not covered with the shielding conductor layer 214. The shielding conductor layer 214 after etching functions as a field plate of the LDMOS device.

In an example, the width of the portion of the first insulating layer 208 that is exposed by the shielding conductor layer 214 and disposed above the source region 206 is determined according to voltage tolerance requirements of the LDMOS device.

In an example, the shielding conductor layer 214 is a doped polysilicon layer.

As shown in FIG. 6F, a third insulating layer 215 is deposited on the shielding conductor layer 214 and on the upper surface of the first insulating layer 208 exposed by the shielding conductor layer 214, and then a surface of the third insulating layer 215 undergoes chemical mechanical polishing.

Optionally, the third insulating layer 215 has a thickness of 0.8~1.2 µm.

Optionally, the third insulating layer 215 is an oxide layer.

As shown in FIG. 6G, the method further includes etching sequentially the third insulating layer 215 and the first insulating layer 208, which are above the source region 206, and etching the source region 206, the well region 204, and the epitaxial layer 202 sequentially until the upper surface of the substrate 201 is partially exposed so as to form a first trench 216. The first trench 216 has a width no greater than that of the source region 206. The upper surface of the substrate 201 is partially exposed by the first trench 216.

Isotropic etching is then performed on the insulating layers (including the third insulating layer 215 and the first insulating layer 208) from inside the first trench 216 according to the width of the source region 206 to expose partially the source region 206; thus, the first trench 216 and the gate structure 203 are spaced apart from each other by the insulating layers. Upon completion of the etching process, the first trench 216 and the gate structure 203 are still spaced apart from each other by the insulating layers.

In an embodiment, the process of etching the insulating layers involves controlling the width of the lateral etching (i.e., the isotropic etching), such that an upper portion of the first conducting channel 209 and the gate structure 203 are spaced apart by 0.1~0.3 µm with the first insulating layer 208 filing the space between the upper portion of the first conducting channel 209 and the gate structure 203.

In an embodiment, as shown in FIG. 6H, ions of the first dopant type are implanted at a predetermined angle into the first trench 216 to form the body contact region 217, in the substrate 201, wherein the body contact region 217 is of the first dopant type, is highly doped, and is at least partially exposed by the first trench 216. The body contact region 217 and the source region 206 are connected by the first trench 216.

In an embodiment, a doped region 218 of a first dopant type is formed between the epitaxial layer 202 (inclusive of the well region 204) and the first trench 216. The doped region 218 is highly doped, and connects the source region 206 and the substrate 201. A sidewall of the doped region 218 dopant type adjoins the sidewall of the first trench 216 to enhance EAS capability of the LDMOS device.

In an embodiment, implanting ions of the first dopant type into the first trench 216 at a predetermined angle comprises: implanting dopants of a first dopant type into the sidewall of the epitaxial layer 202 (inclusive of the well region 204) adjoining the first trench 216, at an angle of 0~7° relative to the vertical direction.

As shown in FIG. 6I, the first trench 216 is filled with a first conductive material to form a first conducting channel 209. The first conducting channel 209 extends sequentially through the insulating layers (including the third insulating layer 215 and the first insulating layer 208), the source region 206, the well region 204, and the epitaxial layer 202. The first trench 216 extends to the substrate 201. A lower surface of the first conducting channel 209 is in contact with the substrate 201 so that the first conducting channel 209 connects the source region 206 and the substrate 201. A protrusion 220 is formed at a side of the first conducting channel 209 and starts at about position where the first conducting channel 209 and the upper surface of the source region 206 meet. The first conducting channel 209 is divided into two parts, the upper portion and a lower portion, from the protrusion 220. The width of the upper portion of the first conducting channel 209 is greater than the width of the lower portion of the first conducting channel 209.

The first conductive material includes, but is not limited to, metallic compounds, such as tungsten silicide and titanium nitride.

As shown in FIG. 6J, after the first conducting channel 209 is formed, a second insulating layer 210 is formed on the upper end of the first conducting channel 209 and the upper surface of the third insulating layer 215. Then, the surface of the second insulating layer 210 undergoes chemical mechanical polishing.

As shown in FIG. 6K, the method further includes: etching, with the second insulating layer 210 functioning as a mask, the second insulating layer 210, the third insulating layer 215, and the first insulating layer 208 sequentially until the drift region 205 is partially exposed, to form a second trench 221; and then forming a drain region 207 in the drift region 205, wherein the drain region 207 is heavily doped, is of the second dopant type, and is partially exposed by the second trench 221.

As shown in FIG. 6L, the method further includes filling the second trench 221 with a second conductive material and then performing an etch back process to form a second conducting channel 211. The second conducting channel 211 extends through the second insulating layer 210, the third insulating layer 215, and the first insulating layer 208 sequentially, and its lower surface is in contact with the drain region 207.

In an embodiment, the second conductive material includes, but is not limited to, metallic compounds, such as tungsten silicide and titanium nitride. The second conductive material is identical to or different from the first conductive material, and the disclosure is not limited thereto.

As shown in FIG. 6M and FIG. 6N, the method further includes: depositing a metallic layer on the upper surface and sidewalls of the whole device and etching the metallic layer to form a drain electrode 212 and a gate electrode (not indicated by any reference numeral). The drain electrode 212 covers the upper surface of the second conducting channel 211; thus, the second conducting channel 211 connects the drain region 207 and the drain electrode 212.

After thinning the substrate 201, a source electrode 213 is deposited on a surface of the substrate 201 facing away from the epitaxial layer 202.

When a chip product adopts the LDMOS device, edges of the chip are connected to the source electrode 213 and the shielding conductive layer to render their electric potentials equal, thereby enhancing the stability and reliability of the LDMOS device.

In one or more other embodiments, the LDMOS device fabricated with the above mentioned method dispenses with the shielding conductor layer 214 and the third insulating layer 215, in which case, the corresponding method may dispense with the steps illustrated by FIG. 6D through FIG. 6F and the corresponding steps illustrated by FIGS. 6C~6N may dispense with the shielding conductor layer 214 and third insulating layer 215.

The above embodiments are illustrative of the principles and benefits of the disclosure rather than restrictive of the scope of the disclosure. Persons skilled in the art can make modifications and changes to the embodiments without departing from the spirit and scope of the disclosure. Therefore, all equivalent modifications and changes made by persons skilled in the art without departing from the spirit and technical concepts disclosed in the disclosure shall still be deemed falling within the scope of the claims of the disclosure.

What is claimed is:

1. An LDMOS device, comprising:
   a substrate, which is of a first dopant type;
   an epitaxial layer, which is of the first dopant type and is formed on an upper surface of the substrate;
   a gate structure disposed on an upper surface of the epitaxial layer;
   a well region, which is of the first dopant type, and a drift region, which is of a second dopant type, wherein the well region and the drift region are disposed in the epitaxial layer, wherein the first dopant type and the second dopant type contain opposite dopants;
   a source region, which is of the second dopant type and is disposed within the well region;
   a drain region, which is of the first dopant type and is disposed within the drift region;
   a first insulating layer, covering an upper surface and two sidewalls of the gate structure and the upper surface of the epitaxial layer;
   a first conducting channel, extending through the first insulating layer, the source region, and the epitaxial layer before reaching the substrate, wherein the first conducting channel is in contact with a side surface and an upper surface of the source region, wherein the first conducting channel electrically connects the source region and the substrate;
   a second insulating layer, disposed above the first conducting channel and the first insulating layer;
   a second conducting channel, extending to an upper surface of the drain region;
   a drain electrode, connected to the drain region by the second conducting channel;
   a gate electrode, connected to the gate structure; and
   a source electrode, disposed on a surface of the substrate facing away from the epitaxial layer.

2. The LDMOS device of claim 1, wherein a protrusion is formed at a side of the first conducting channel, wherein an end of the protrusion is located at where the first conducting channel and the upper surface of the source region meet, wherein an extension of the end of the protrusion divides the first conducting channel into an upper portion and a lower portion, and wherein a width of the upper portion of the first conducting channel is greater than a width of the lower portion of the first conducting channel.

3. The LDMOS device of claim 1, wherein the upper portion of the first conducting channel and the gate structure are spaced apart by a gap in a range of 0.1 μm to 0.3 μm, wherein the first insulating layer fills the gap between the first conducting channel and the gate structure.

4. The LDMOS device of claim 1, further comprising a body contact region, which is of the first dopant type, wherein the body contact region is disposed in the substrate and connected to the source region by the first conducting channel.

5. The LDMOS device of claim 4, further comprising a doped region disposed in the epitaxial layer, wherein the doped region is disposed adjacent to the first conducting channel, and wherein the doped region connects the source region and the substrate.

6. The LDMOS device of claim 1, further comprising a shielding conductor layer and a third insulating layer, wherein the shielding conductor layer is disposed on the first insulating layer, above a portion of the gate structure and a portion of the drift region, and wherein the third insulating layer covers an upper surface and sidewalls of the shielding conductor layer, and wherein the third insulating layer is disposed on an upper surface of the first insulating layer exposed from the shielding conductor layer.

7. The LDMOS device of claim 6, wherein the second insulating layer is disposed above the first conducting channel and the first insulating layer, wherein the second insulating layer is disposed on an upper end of the first conducting channel and on an upper surface of the third insulating layer above the first insulating layer.

8. The LDMOS device of claim 6, wherein the first conducting channel extends in an upper to lower order through the third insulating layer, the first insulating layer, the source region, and the epitaxial layer.

9. The LDMOS device of claim 6, wherein the second conducting channel extends through the second insulating layer, the third insulating layer, and the first insulating layer, and wherein the second conducting channel is in contact with the drain region.

* * * * *